United States Patent [19]

Takanashi et al.

[11] 4,209,581

[45] Jun. 24, 1980

[54] SOLUBLE PHOTOSENSITIVE RESIN COMPOSITION

[75] Inventors: Hiroshi Takanashi, Tokyo; Toshimi Aoyama, Yokohama; Hisashi Nakane, Kawasaki, all of Japan

[73] Assignee: Tokyo Ohka Kogyo Kabushiki Kaisha, Kawasaki, Japan

[21] Appl. No.: 945,341

[22] Filed: Sep. 25, 1978

Related U.S. Application Data

[63] Continuation of Ser. No. 749,987, Dec. 13, 1976, abandoned.

[51] Int. Cl.$^2$ ............................................. G03C 1/68
[52] U.S. Cl. .............................. 430/283; 204/159.16; 204/159.15; 430/286; 430/288
[58] Field of Search .................. 96/115 P, 115 R; 204/159.15, 159.16; 260/70 M, 851

[56] References Cited

U.S. PATENT DOCUMENTS

| | | | |
|---|---|---|---|
| 3,427,161 | 2/1969 | Laridon et al. | 96/35.1 |
| 3,734,725 | 5/1973 | Bailey | 96/115 R |
| 3,801,638 | 4/1974 | Cerwonka | 96/115 P |
| 3,809,633 | 5/1974 | Magnotta et al. | 96/115 P |
| 3,833,384 | 9/1974 | Noonam et al. | 96/115 P |
| 3,867,548 | 2/1975 | Hirschmann | 260/70 M |

*Primary Examiner*—Jack P. Brammer
*Attorney, Agent, or Firm*—Brisebois & Kruger

[57] ABSTRACT

A photocurable soluble resin suitable for manufacturing photosensitive resin plates obtained by polycondensing an alkylol derivative or an alkylated alkylol derivative of urea or thiourea with an N-alkylolacrylamide or N-alkylolmethacrylamide in the presence of an acid or an ammonium salt thereof or by reacting urea or thiourea with formaldehyde to form a linear polycondensation product and then grafting an N-alkylolacrylamide or N-alkylolmethacrylamide on the linear polycondensation product in the presence of an acid or an ammonium salt thereof. This soluble resin is incorporated with known soluble resins such as soluble nylon, photosensitizers and thermal polymerization inhibitors and mixed thoroughly to obtain a soluble photosensitive resin composition.

6 Claims, No Drawings

SOLUBLE PHOTOSENSITIVE RESIN COMPOSITION

This is a continuation of application Ser. No. 749,987, filed Dec. 13, 1976 now abandoned.

BACKGROUND OF THE INVENTION

The present invention relates to a new soluble photosensitive resin and a composition comprising same suitable as a material for manufacturing photosensitive resin plates. More particularly, the present invention relates to a soluble photosensitive resin and a composition comprising same which has excellent compatibility with various soluble resins and can be washed out with water or an alcohol substantially free from other materials and processed by a simple operation to a thick printing plate with high hardness.

In the prior art, a composition comprising polyvinyl alcohol, acrylamide and a photosensitizer (Japanese Pat. Publn. No. 25941/64), a composition comprising a graft polymerization product of polyvinyl alcohol and a photosensitizer (Japanese Patent Publn. No. 28275/69) and a photosensitive compound obtained by esterifying polyvinyl alcohol with an unsaturated carboxylic acid or a halide thereof (Japanese Patent Publn. 6962/73) are known as soluble photosensitive resins and a combination of polyvinyl alcohol with a diazonium salt or a tetrazonium salt is known in the field of screen printing. Known soluble resins, other than polyvinyl alchohol, are polyacrylamide, polyacrylic acid or sodium salts thereof, cellulose or derivatives thereof, polyvinyl ether and polyvinylpyrrolidone.

Introduction of photoreactive groups into polyvinyl alcohol brings about enhanced water-resistance, chemicals-resistance and hardness but on the other hand results in poor developability and accompanies such a disadvantage that difficulty exists in finding appropriate reaction conditions and purification treatments because of using a polymer as a reactant. As a problem arises in compatibility of conventional photosensitive materials, i.e. compounds having a polymerizable double bond with polyvinyl alcohol, the use of a photosensitive material in combination with polyvinyl alcohol brings about such a drawback that plates with satisfactory hardness and water-resistance are hardly obtained.

Plates with various physical characteristics are obtained by incorporating a soluble photosensitive resin with a soluble resin. Nylon possessing excellent abrasion-resistance and moderate flexibility is known to be suitable as such soluble resin.

What is chiefly demanded in using a photosensitive resin composition of nylon series is to shorten the time required for making plates and to reduce cost. Thinkable as a means for shortening the time required for making plates is to shorten the time required for image-forming exposure and the subsequent developing, i.e. washing with a solvent. Many attempts including the use of a larger amount of the photoreactive component and the use of a compound higher in reactivity have been made hitherto as a means for shortening the time required for image-forming exposure. However, none of these attempts has proved satisfactory because of such difficulties that the amount of the photoreactive component incorporated is inevitably limited in view of compatibility with nylon and that a new compound meeting the desired purpose must be developed in the case of compound higher in reactivity. On the other hand, the wash-out time in washing the material with a solvent after the exposure treatment depends on solubility of the nylon component. Thus, increase in the amount of a plasticizer is thinkable to shorten the wash-out time. Certainly, increase in the amount of a plasticizer results in enhancement of solubility of the nylon component but the quality of the resultant plate, for example, clarity of lines and mechanical strength are poor and not satisfactory in practical use.

As a result of extensive research made to overcome these disadvantages of the prior art soluble photosensitive resins and photosensitive resin compositions and to develop a photocurable soluble resin which has satisfactory hardness and water-resistance and is excellent in developability and a resin composition comprising the photocurable resin, it has now been found that this purpose can be attained by producing a polycondensate containing a unit comprising an alkylol derivative or alkylated alkylol derivative of urea or thiourea and a unit comprising an N-alkylolacrylamide or N-alkylolmethacrylamide. The present invention is based on the above finding.

BRIEF SUMMARY OF THE INVENTION

In accordance with the present invention there is provided a photocurable soluble resin suitable as a material for manufacturing photosensitive resin plates which is produced by polycondensing an alkylol derivative or alkylated alkylol derivative of urea or thiourea with an N-alkylolacrylamide or N-alkylolmethacrylamide in the presence of an acid or an ammonium salt thereof or by reacting urea or thiourea with formaldehyde to form a linear polycondensation product and then grafting an N-alkylolacrylamide or N-alkylolmethacrylamide on the polycondensation product in the presence of an acid or an ammonium salt thereof. By the term "soluble resin" is meant herein a resin which is soluble in water, an alcohol or a mixture thereof.

It is an object of the invention to provide a photocurable soluble resin having satisfactory hardness and water-resistance with excellent developability.

It is another object of the invention to provide a soluble photosensitive resin composition which is excellent in sensibility, maintains flexibility after photocuring and has a shortened developing time.

It is still another object of the invention to provide a soluble photosensitive resin composition which produces plates with good abrasion-resistance and moderate flexibility.

Other and further objects, features and advantages of the invention will appear more fully from the following description.

DETAILED DESCRIPTION OF THE INVENTION

The alkylol derivative or alkylated alkylol derivative of urea or thiourea used in the present invention is represented by the general formula:

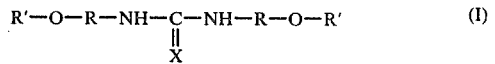

or

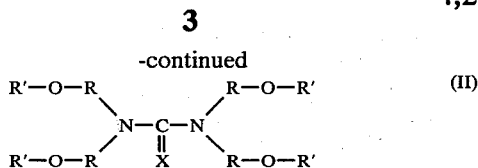

wherein X is oxygen or sulfur, R is an alkylene such as methylene, ethylene, propylene, butylene or isobutylene, and R' is a hydrogen or alkyl such as methyl, ethyl, propyl, butyl or isobutyl.

Illustrative of the compound of the general formula (I) are, for example, N,N'-dimethylolurea, N,N'-diethylolurea, N,N'-dipropylolurea, N,N'-bis(methoxymethyl)urea, N,N'-bis(ethoxy-methyl)urea, N,N'-bis(propoxymethyl)urea, N,N'-bis(methoxyethyl)-urea and N,N'-bis(ethoxypropyl)urea. Examples of the compound of the general formula (II) include N,N,N'N'-tetramethylolurea, N,N,N',N'-tetraethylolurea, N,N,N',N'-tetrapropylolurea, N,N,N',N'-tetrakis(methoxymethyl)urea N,N,N',N'-tetrakis(ethoxymethyl)urea, N,N,N',N'-tetrakis(ethoxymethyl)urea and N,N,N',N'-tetrakis(ethoxyethyl)urea, N,N,N',N'-tetrakis(ethoxypropyl)urea. At least two alkylol or alkylated alkylol groups attached to the nitrogen atoms in these compounds need not be the same but may differ from each other.

Examples of the alkylol group in the above-mentioned N-alkylolacrylamide or N-alkylolmethacrylamide include methylol, ethylol, propylol, butylol and isobutylol groups.

Illustrative of the acid catalyst used for the polycondensation reaction or the grafting reaction according to the process of this invention are, for example, inorganic acids such as hydrochloric acid, sulfuric acid and phosphoric acid; organic acid such as formic acid, oxalic acid and tartaric acid; p-toluenesulfonic acid and sulfamic acid as well as ammonium salts thereof.

The process of the present invention is preferably carried out by dissolving the derivative of urea or thiourea, N-alkylolacrylamide or N-alkylolmethacrylamide, the catalyst and a thermal polymerization inhibitor such as methylhydroquinone in water or an organic solvent and heating the mixture at 75°-90° C. for 1-3 hours with stirring. If desired, the reactants may be reacted in molten state without using any solvent reaction medium. The reactivity and physical characteristics of the polycondensate obtained in this manner can be modified by varying the ratio of the urea component to the acrylamide component, so that it is possible to regulate the hardness and flexibility of the plate material adequately.

The proportion of the urea component to the acrylamide component is preferably within a range of 2:1–1:4 in terms of molar ratio. If the proportion of the urea component becomes greater and oversteps the above range, the resultant plate will be too flexible for practical use and poor in compatibility. On the other hand, if the proportion of the acrylamide component becomes greater and oversteps the above range, the resultant plate will have sufficient hardness but the composition will become poor in compatibility with other components.

As in the case of producing urea resins, it may be expected that the alkylolurea will undergo three-dimensional polycondensation through its methylene linkage and dimethylene ether linkage when heated together with an acid catalyst, whereby an insoluble and infusible substance is formed. However, the polycondensate obtained according to the present invention is acid and heat stable.

According to another embodiment of the present invention, urea or thiourea is reacted in a usual manner with formaldehyde in aqueous solution to form an initial linear polycondensate to which, prior to its conversion into an insoluble and infusible substance, an N-methylolacrylamide is added to form a photosensitive resin by grafting the N-methylolacrylamide on the main chain of the urea resin while inhibiting three-dimensional cross-linking reaction of the urea resin.

Urea or thiourea can be reacted with formaldehyde in any desired molar ratio, but the molar ratio of these reactants is preferably within a range from about 1:1 to about 1:2. Usually, the linear initial polycondensate has a polymerization degree of about 500, preferably 200–500. The proportion of the linear initial polycondensate obtained in this manner to the acrylamide component is preferably within a range from 2:1 to 1:4 in molar ratio. The compound prepared in this manner did not become insoluble when heated at 75°–90° C. with stirring for 5–6 hours in the presence of an acid or an ammonium salt thereof. When N-methylolacrylamide was not added to the above compound, however, it became insoluble in about 10 minutes.

As the polycondensate obtained according to the process of this invention shows in IR-absorption spectral analysis the characteristic absorption bands of urea resin at 3400 cm$^{-1}$, 3000 cm$^{-1}$, 1680 cm$^{-1}$, 1540 cm$^{-1}$, 1380 cm$^{-1}$, 1100 cm$^{-1}$, 1020 cm$^{-1}$ and 730 cm$^{-1}$ and the characteristic absorption band of acrylamide methyl group at 800 cm$^{-1}$, the polycondensate is supposed to have such structure that N-methylolacrylamide is bonded to the imino groups in the main chain and in the terminal groups of the main chain of the urea resin.

The polycondensate or the graft polymer obtained in the above mentioned manners becomes insoluble on exposure to light and therefore is suitable as an active ingredient of a photosensitive resin composition.

A water-soluble photosensitive resin composition prepared by mixing (A) 100 parts by weight of a known conventional soluble resin, (B) 1-200 parts by weight of the polycondensate or graft polymer obtained according to this invention, (C) 0.01-10 parts by weight of a photosensitizer and (D) 0.01-5 parts by weight of a thermal polymerization inhibitor thoroughly affords a photosensitive resin plate with high hardness and water-resistance after a given processing to plates.

In a combination of the component (A) with the polycondensate or graft polymer as the component (B), at least 15 parts by weight of the latter per 100 parts by weight of the former result in the formation of images of good quality. By using other polymerizable compounds jointly, however, the component (B) in an amount less than 15 parts by weight is sufficient enough to produce images of good quality. In general, if the amount of the component (B) exceeds 200 parts by weight, exudation or softening will take place, thus making the photosensitive resin plate impossible use as a solid plate.

Examples of the soluble resins used as the component (A) include polyvinyl alcohol and a derivative thereof, polyvinyl ether, hydroxymethylcellulose, hydroxyethylcellulose, hydroxypropylcellulose, a water-soluble alkyd resin, poly(ethylene oxide), polyvinylpyrrolidone, polyacrylic acid and its sodium salt, a copolymer of maleic acid, and soluble nylons such as nylon 8, nylon 6/nylon 66, nylon 6/nylon 66/nylon 610, nylon 6/nylon 66/nylon 610/nylon 612 and 4,4'-diaminodicyclohexylmethane/hexamethylenediamine/adipic acid/ε-caprolactam copolymer as well as sulfonated products of these soluble nylons.

Examples of the photosensitizer used as the component (C) include benzophenone and a derivative thereof, benzoin and a derivative thereof, a sulfur compound, riboflavin, uranyl nitrate, a halogen compound and a photoreductive pigment.

Examples of the thermal polymerization inhibitor used as the component (d) include a phenol derivative, a hydroquinone derivative, a benzoquinone derivative, a copper compound and a nitroso compound.

Such photosensitive resin composition forms a photosensitive resin plate with good physical characteristics when subjected to an image-forming treatment. For the purpose of further improving the physical characteristics of the plate, the photosensitive resin composition may be incorporated with a bridging or crosslinking agent having one or more polymerizable vinyl groups, for example, acrylamide, acrylate or a derivative thereof such as N-methylolacrylamide, triacrylformal, diacrylamidodimethylene ether, methylene-bis(acrylamide), diacetone acrylamide, hydroxyethyl acrylate, hydroxypropyl acrylate or tetraethylene-glycol diacrylate, acrylic acid and its sodium, zinc, calcium or aluminum salt. The photosensitive resin composition may also be incorporated with a conventional plasticizer, for example, the one for polyvinyl alcohol such as ethylene glycol, trimethylene glycol, tetramethylene glycol, pentamethylene glycol, propylene glycol, glycerol, 2,3-butanediol, 1,3-butanediol, diethylene glycol or triethylene glycol.

Such plasticizer is added preferably in an amount of about 30-40% by weight to the composition when the plate is used as a direct printing plate for which flexibility is required. However, the use of such plasticizer should be avoided as far as possible when the plate requires satisfactory hardness for making a paper printing mold.

In the manufacture of a printing plate from the photosensitive resin composition of the present invention, the composition is dissolved in a proper organic solvent, for example, an alcohol such as methanol or ethanol and the solution is spread on a flat plane and dried whereby a photosensitive layer is formed. After the photosensitive layer is bound to an appropriate support with an adhesive, the resultant photosensitive element is overlaid with a negative and image-forming exposure is carried out according to a usual method. The element is then treated with an alcohol to wash out unexposed areas whereupon a printing plate of a good quality is obtained. The wash-out treatment in this case can be carried out easily by using a spray, brush or sponge.

The present invention will be more clearly understood with reference to the following example.

EXAMPLE 1

In 10 parts by weight of water was dissolved 0.025 part by weight of methylhydroquinone. To this solution were added 148 parts by weight of dimethylolurea dimethyl ether, 50.5 parts by weight of N-methylolacrylamide and 2 parts by weight of ammonium chloride. The mixture was stirred at 80° C. for 2 hours.

A transparent, viscous, threading polycondensate was thus obtained, which was then added to 1000 parts by weight of acetone with vigorous stirring to effect reprecipitation. The precipitate was collected by filtration and dried under reduced pressure whereby 110 parts by weight of a white resin were obtained. This product was soluble in water and an alcohol but insoluble in acetone and showed a strong absorption band at 800 $cm^{-1}$ in IR-absorption spectrum analysis.

EXAMPLE 2

In 10 parts by weight of water was dissolved 0.025 part by weight of methylhydroquinone. To this solution were added 74 parts by weight of dimethylolurea dimethyl ether, 202 parts by weight of N-methylolacrylamide and 2 parts by weight of ammonium chloride. The mixture was stirred for 2 hours at 80° C. The reaction mixture was then poured into 1000 parts by weight of acetone and the precipitate formed was removed by filtration.

Acetone was removed from the filtrate by distillation whereby viscid polymeric condensate was obtained. This product was soluble in water, an alcohol and acetone and showed a strong absorption band at 800 $cm^{-1}$ in IR-absorption spectrum analysis.

The treatment was carried out in the same manner as described above except that 60 parts by weight of dimethylolurea were used in place of 74 parts by weight of dimethylolurea dimethyl ether used in this example, whereby substantially the same result as described above was obtained.

EXAMPLE 3

To dimethylolurea di-n-butyl ether obtained by reacting 12 parts by weight of dimethylolurea with 74 parts by weight of n-butanol in the presence of 0.4 part by weight of 5% oxalic acid were added 20 parts by weight of N-methylolacrylamide, 1 part by weight of ammonium borate, 0.25 part by weight of methylhydroquinone and 3 parts by weight of water. The mixture was stirred for 2 hours at 80° C. The resultant transparent, viscid substance was then poured into 1000 parts by weight of acetone and the precipitate formed was removed by filtration. Acetone was evaporated from the filtrate and the residue was dried under subatmospheric pressure. The viscid substance thus obtained was soluble in water, an alcohol and acetone and showed nearly the same absorption as in Example 2 except that an absorption band was observed in this Example 3 at 2860-2960 $cm^{-1}$ based on butyl group.

EXAMPLE 4

30 Parts by weight of di-n-butylolurea. 37.1 parts by weight of N-methylolacrylamide, 10 parts by weight of water, 0.1 part by weight of methylhydroquinone and 1 part by weight of ammonium oxalate were mixed and stirred at 80° C. in a water bath whereby a condensation reaction was carried out. The reaction mixture became a transparent viscous substance in 1.5 hours which turned white and mud-like after 20 hours.

The product after reprecipitation from acetone showed absorption bands at 3200 $cm^{-1}$, 1250 $cm^{-1}$, 1130 $cm^{-1}$ and 1025 $cm^{-1}$ in IR-absorption spectrum analysis.

EXAMPLE 5

To 64 parts by weight of an initial polycondensate (polymerization degree: about 300) obtained by reacting an equimolar mixture of thiourea and urea with formaldehyde in a mol ratio of about 1:2 were added 10 parts by weight of water, 202 parts by weight of N-methylolacrylamide and 2 parts by weight of ammonium propionate. The mixture was stirred for 2 hours at 80° C. whereby a viscous grafted condensate was obtained.

EXAMPLE 6

A mixture of 10 parts by weight of the polycondensate obtained in Example 2, 10 parts by weight of polyvinyl alcohol with a polymerization degree of 500 and a saponification value of 86–89 mol % and 0.135 part by weight of sodium anthraquinone-2,7-disulfonate was melted at 90° C. in a water bath and stirred to obtain a photosensitive resin composition.

The composition thus prepared was spread on a flat, smooth chromium-plated steel plate and dried overnight whereby a photosensitive layer of 0.7 mm in thickness was obtained. During this operation, neither precipitation of crystals nor exudation of oily substance was observed within or at the surface of the resin. The photosensitive layer was then peeled off and attached to an aluminum panel by the aid of an adhesive coated on the dry surface. The aluminum panel thus treated was allowed to stand overnight in nitrogen atmosphere and subjected to a qualification test for plates after satisfactory gas substitution.

The photosensitive layer was overlaid with a test negative, placed in a position at a distance of 2.4 cm from a chemical lamp (Model FL-20BL manufactured by Toshiba, Japan) and subjected to a vacuum contact printing operation using an exposure time of 2,4,6,8 or 10 minutes. The exposed layer was then developed with water kept at 25° C. for 4.5 minutes using a spray type washout machine operated under a spray pressure of 2.7 kg/cm².

As a result of the test, "tortuosity" phenomenon was observed in a 70μ isolated line in the case of 2 minute exposure but such phenomenon was not observed and a fine line was printed instead in the case of the exposure time being at least 4 minutes. The shoulder angle in this case was 60° C.

A 200μ isolated dot was formed clearly even in the case of 2 minute exposure. A plate obtained by subjecting the plate thus washed to a post-exposure treatment conducted for 6 minutes had a Shore D hardness of 75° and had excellent ink transfer. By further subjecting the plate to a heat treatment conducted at 140° C. for 5 minutes, the hardness of the plate was increased to 83° which was hard enough to make 15 plates of a paper mold.

In this example, a composition was prepared by using 2.6 parts by weight of dimethylolurea dimethyl ether and 7.4 parts by weight of N-methylolacrylamide in place of 10 parts by weight of the polycondensate and spread on a chromium-plated steel plate to prepare a photosensitive layer. However, such photosensitive layer began to permit precipitation of a crystalline substance three days after the preparation and became entirely opaque after a week. The same qualification test for plates as described above was also performed using this plate before precipitation of the crystalline substance. In this test, the plate was swollen considerably with the wash-out solution so that a 70μ isolated line was detached from the support in the case of 2–4 minute exposure or became "tortuous" in the case of 6–10 minute exposure. A 200μ isolated dot was detached in the case of 2–4 minute exposure or was in the state of barely clinging to the aluminum support in the case of 6 minute exposure.

This result shows that a composition comprised of a mere mixture of the starting materials without subjecting them to polycondensation is not proper for the manufacture of printing plates.

EXAMPLE 7

Using the polycondensate obtained in Example 1, a photosensitive layer was prepared exactly in the same manner as described in Example 6 and then subjected to a qualification test for plates. As to the 70μ isolated line, a good result was obtained in the case of an exposure time of at least 4 minutes. As to the 200μ isolated dot, a good result was obtained in the case of an exposure time of at least 2 minutes. The Shore D hardness value of the plate was 68° and so was slightly more flexible than that of Example 6.

EXAMPLE 8

A photosensitive resin composition was prepared by mixing 150 parts by weight of the polycondensate obtained in Example 2, 500 parts by weight of a 20% aqueous solution of polyacrylamide and 0.109 part by weight of sodium anthraquinone-β-sulfonate in the same manner as described in Example 6.

The composition was spread on a chromium-plated steel plate to form a photosensitive layer. Even after drying the layer overnight by sending air, however, the layer was still sticky. The surface of the layer was covered with a polyester film of 100μ in thickness and the resulting layer was subjected to a qualification test for storage and plates. During storage, no phase separation took place and the layer was kept homogeneous for a long period of time.

The image-forming exposure treatment was performed by placing a negative on the polyester film and the vacuum contact printing treatment was carried out in the same manner as described in Example 6. After the exposure treatment, the polyester film was removed and the layer was washed with water for 2 minutes. As a result of the test, a 70μ isolated line was not "tortuous" in the plates exposed for at least 6 minutes and a 200μ isolated dot was fine in the plates exposed for at least 4 minutes. The hardness of the plate after post-exposure was 70° in terms of Shore D hardness.

EXAMPLE 9

A photosensitive resin composition was prepared by mixing 10 parts by weight of the polycondensate obtained in Example 2, 10 parts by weight of hydroxypropylcellulose, 0.135 part by weight of sodium anthraquinone-2,6-disulfonate, 0.01 part by weight of methylhydroquinone and 10 parts by weight of water in the same manner as described in Example 6.

Using the above composition, a photosensitive layer was prepared in the same manner as described in Example 6 whereby the layer was maintained homogeneous without occurrence of any phase separation but was somewhat bad in transparency. As a result of the test, a 70μ isolated line was not "tortuous" in the plates exposed for at least 8 minutes and a 200μ isolated dot was fine in the plates exposed for at least 6 minutes. This resin layer was more flexible than similar resin layers obtained in other Examples. The Shore D hardness of the plate after post-exposure was 60°.

EXAMPLE 10

Using the polycondensate obtained in Example 3, a photosensitive resin composition was prepared in the cipitation of a crystalline substance in the resin layer was prevented. Referential Example Comparison in wash-out rate was made between a commercially available resin plate and the resin plates obtained in Examples of this invention. Each sample was treated, using a spray type wash-out machine operated under a spray pressure of 2.5 kg/cm² and at a liquid temperature of 30°–35° C., whereby the time required to wash out the resin in unexposed areas per millimeter in depth was measured. A result of the test is shown in the following table:

| Sample | Wash-out rate (min./mm) |
| --- | --- |
| Commercially available resin plate | 12.9 |
| Example 13 of this invention | 8.7 |
| Example 14 of this invention | 5.3 |
| Example 15 of this invention | 5.9 |

As is evident from the table, the resin plates prepared from the composition of the present invention are significantly improved in the wash-out rate as compared with the known conventional one.

What is claimed is:

1. A soluble photosensitive resin composition comprising:
   (A) 100 parts by weight of at least one soluble resin that is different from (B),
   (B) 1–200 parts by weight of photocurable polycondensates of an alkylol derivative or an alkylated alkylol derivative of urea or thiourea represented by the general formula:

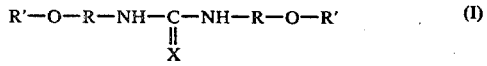

-continued

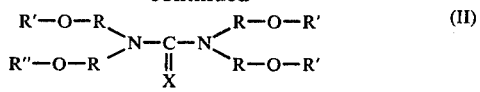

wherein X is oxygen or sulfur, R is an alkylene and R' is hydrogen or alkyl, with a N-alkylol-acrylamide or N-alkylolmethacrylamide, the molar ratio of said urea component to said acrylamide component being within a range of 2:1–1:4, and
   (C) 0.01–10 parts by weight of a photosensitizer.

2. The soluble photosensitive resin composition of claim 1 which also contains a thermal polymerization inhibitor.

3. The soluble photosensitive resin composition of claim 1 wherein said soluble resin is at least one selected from the group consisting of polyvinyl alcohol and a derivative thereof, polyvinyl ether, hydroxymethylcellulose, hydroxyethylcellulose, hydroxypropylcellulose, a water-soluble alkyd resin, poly(ethylene oxide), polyvinylpyrrolidone, plyacrylic acid and its sodium salt, a copolymer of maleic acid and soluble nylons.

4. The soluble photosensitive resin composition of claim 1 containing a bridging or crosslinking agent having one or more polymerizable vinyl groups.

5. The soluble photosensitive resin composition of claim 1 wherein said component (B) is a polycondensate obtained by polycondensing an alkylol derivative or an alkylated alkylol derivative of urea or thiourea with a N-alkylolacrylamide or N-alkylolmethacrylamide in the presence of an acid or an ammonium salt thereof.

6. The soluble photosensitive resin composition of claim 1 wherein said component (B) is a grafted product obtained by reacting urea or thiourea with formaldehyde to form a linear polycondensation product and then grafting a N-alkylolacrylamide or N-alkylolmethacrylamide on the linear polycondensation product in the presence of an acid or an ommonium salt thereof.

* * * * *

UNITED STATES PATENT AND TRADEMARK OFFICE
CERTIFICATE OF CORRECTION

PATENT NO. : 4,209,581
DATED : June 24, 1980
INVENTOR(S) : Hiroshi Takanashi, Toshimi Aoyama, Hisashi Nakane It is certified that error appears in the above—identified patent and that said Letters Patent is hereby corrected as shown below:

[30] Foreign Application Priority Data

December 22, 1975 Japan....................sho.50-152976

*Signed and Sealed this*

*Twelfth* Day of *August 1980*

[SEAL]

Attest:

SIDNEY A. DIAMOND

*Attesting Officer*     *Commissioner of Patents and Trademarks*